United States Patent
Higgins, III et al.

(10) Patent No.: US 9,219,028 B1
(45) Date of Patent: Dec. 22, 2015

(54) DIE-TO-DIE INDUCTIVE COMMUNICATION DEVICES AND METHODS

(71) Applicant: FREESCALE SEMICONDUCTOR, INC., Austin, TX (US)

(72) Inventors: Leo M. Higgins, III, Austin, TX (US); Fred T. Brauchler, Canton, MI (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/573,674

(22) Filed: Dec. 17, 2014

(51) Int. Cl.
| | |
|---|---|
| H01L 23/48 | (2006.01) |
| H01L 23/495 | (2006.01) |
| H01L 23/538 | (2006.01) |
| H01L 23/64 | (2006.01) |
| H01L 49/02 | (2006.01) |

(52) U.S. Cl.
CPC ...... *H01L 23/49575* (2013.01); *H01L 23/5386* (2013.01); *H01L 23/5389* (2013.01); *H01L 23/645* (2013.01); *H01L 28/10* (2013.01)

(58) Field of Classification Search
CPC ............. H01L 23/49575; H01L 23/5386; H01L 23/5389; H01L 23/645; H01L 28/10
USPC ................................. 257/777, 531
See application file for complete search history.

(56) References Cited

U.S. PATENT DOCUMENTS

| | | | |
|---|---|---|---|
| 4,780,795 A | 10/1988 | Meinel | |
| 6,054,780 A | 4/2000 | Haigh et al. | |
| 6,873,065 B2 | 3/2005 | Haigh et al. | |
| 7,112,457 B2 | 9/2006 | Kek et al. | |
| 7,582,960 B2 | 9/2009 | Karnezos | |
| 7,692,444 B2 | 4/2010 | Chen et al. | |
| 7,709,944 B2 | 5/2010 | Kuan et al. | |
| 8,203,214 B2 | 6/2012 | Bathan et al. | |
| 8,237,534 B2 | 8/2012 | Fouquet et al. | |
| 8,427,844 B2 * | 4/2013 | Ho et al. ................ | 361/813 |
| 8,571,360 B2 | 10/2013 | Tay et al. | |
| 8,592,944 B2 | 11/2013 | Santangelo et al. | |

(Continued)

FOREIGN PATENT DOCUMENTS

| | | |
|---|---|---|
| EP | 2509106 A1 | 10/2012 |
| WO | 2010137090 A1 | 12/2010 |

OTHER PUBLICATIONS

Canegallo, R. et al, "3D Contactless Communication for IC Design," IEEE International Conference on Integrated Circuit Design and Technology and Tutorial; Jun. 2-4, 2008; ISBN 978-1-4244-1810-7; pp. 241-244.

(Continued)

*Primary Examiner* — Tu-Tu Ho
(74) *Attorney, Agent, or Firm* — Sherry W. Schumm

(57) ABSTRACT

An embodiment of a packaged device includes first and second package leads, a first integrated circuit (IC) die, and a sub-assembly that includes a second IC die coupled to a substrate. The first IC die has a first coil, and the second IC die has a second coil. The first and second IC die are arranged within the device so that the first and second coils are aligned with each other across a gap between the first and second IC die, and the first and second IC die are galvanically isolated from each other. The first IC die is electrically coupled to the first package lead (e.g., with a wirebond), and a substrate bond pad is electrically coupled to the second package lead (e.g., with a wirebond). The sub-assembly also may include encapsulation at least over a wirebond that electrically couples the second IC die to the substrate.

21 Claims, 10 Drawing Sheets

(56) References Cited

U.S. PATENT DOCUMENTS

| | | | |
|---|---|---|---|
| 8,674,800 B2* | 3/2014 | Willkofer et al. | 336/200 |
| 2010/0328902 A1 | 12/2010 | Ho et al. | |
| 2011/0001587 A1 | 1/2011 | Sutardja | |
| 2011/0049693 A1 | 3/2011 | Nakashiba et al. | |
| 2011/0176339 A1 | 7/2011 | Kerber et al. | |
| 2014/0070420 A1 | 3/2014 | Sapone | |

OTHER PUBLICATIONS

European Search Report mailed Oct. 29, 2014, for EP 14173336, 7 pages.
Non-Final Rejection mailed Jul. 22, 2015 for U.S. Appl. No. 13/930,250, 22 pages.
Notice of Allowance mailed May 22, 2015 for U.S. Appl. No. 14/104,355, 11 pages.
Avago Technologies, "ACPL-M71U and ACPL-M72U, Wide Operating Temperature, High Speed, Low Power Digital Optocouples with R2Coupler Isolation," Data Sheet, www.avagotech.com; Oct. 2, 2012, pp. 1-11.
Chen, B., "iCoupler Products with isoPower Technology: Signal and Pwer Transfer Across Isolation Barrier Using Microtransformers," Analog Devices, www.analog.com, Apr. 2006, pp. 1-4.
Krakauer, D., "Anatomy of a Digital Isolator," Analog Devices, Technical Article MS-2234, www.analog.com, Oct. 2011, pp. 1-3.
Wayne, S. "iCoupler Digital Isolators Protect RS-232, Rs-485, and CAN Buses in Indistrial, Instrumentation, and Computer Applications," Analog Dialogue 39-10, http://www.analog.com/analogdialogue; Oct. 2005, pp. 1-4.
Final Rejection mailed Nov. 5, 2015 for U.S. Appl. No. 13/930,250, 18 pages.
Non-Final Rejection mailed Sep. 29, 2015 for U.S. Appl. No. 14/812.242, 5 pages.

* cited by examiner

DIE-TO-DIE INDUCTIVE COMMUNICATION DEVICES AND METHODS

TECHNICAL FIELD

Embodiments relate generally to inductive communication circuits, systems, and methods.

BACKGROUND

In a variety of applications, electrical (or galvanic) isolation is desired between distinct circuits while enabling communication between those circuits. "Galvanic isolation" means that there is no metallic or electrically conductive path between the distinct circuits. For example, galvanic isolation may be desired to protect a first circuit that operates at a relatively low supply voltage from a second circuit that operates at a relatively high supply voltage. In addition, galvanic isolation may be desired to isolate a first circuit tied to a first voltage reference (e.g., ground) from a second circuit tied to a different voltage reference (e.g., a floating voltage reference). Galvanic isolation also may be desired to prevent extraneous transient signals produced by one circuit from being conveyed to and processed by another circuit as valid signals or data.

A specific application that may benefit from galvanic isolation may be found within an automotive Hybrid Electronic Vehicle (HEV) system, for example. In an HEV system, a circuit that includes an insulated gate bipolar transistor (IGBT) array and corresponding gate drivers (referred to as an "IGBT circuit") may be used to rectify AC power, and to provide the resulting DC power to a high voltage battery (e.g., 300 volts (V) or more). A grounded control circuit (e.g., including a microcontroller) operating at a significantly lower vehicle chassis voltage (e.g., 12 V) may be used to provide control signals to the gate drivers. In order to isolate the control circuit from switching noise from the IGBT circuit, it may be desirable to provide complete galvanic isolation between the control circuit and the IGBT circuit.

In other systems, for safety reasons, it may be desirable to isolate equipment that is connected to an AC power line from conductive portions of the equipment with which users may come into inadvertent physical contact. In such systems, an isolation circuit may be used to mitigate the likelihood of shocks, burns, and/or electrocution from current flowing through a human body to ground.

Conventional techniques for providing electrical isolation include the use of optical isolators, capacitive isolators, transformer-based isolators, and so on. However, these techniques may be non-optimal or unsuitable for some applications, in that they may be expensive, require a large amount of space, consume significant power, and/or have some other characteristics that may reduce their desirability for a given application.

DETAILED DESCRIPTION

As will be described in more detail below, embodiments described herein include inductive communication devices that may be incorporated into systems in which galvanic isolation between circuits is desired. As will be described in more detail later, embodiments of inductive communication devices include at least two IC die, each of which includes at least one conductive coil, arranged so that their respective corresponding coils are each aligned with each other across a gap. Dielectric material is positioned within the gap, where the dielectric material has properties that provide a desired level of galvanic isolation between the coils.

According to an embodiment, each of the IC die also may include communication circuitry (e.g., transmitter, receiver, and/or transceiver circuitry) coupled to the coils, where transmitter-type communication circuitry receives an input signal from circuitry external to the device, converts the input signal into a communication signal that is conducive to inductive communication, and after the communication signal has been inductively communicated between the coils of the two die, receiver-type communication circuitry converts the inductively-communicated signal into an approximation of the input signal, and provides the approximation of the input signal to other external circuitry. According to an embodiment, the first and second IC die and the intervening dielectric material all are packaged within a single integrated circuit package.

Figure 1:
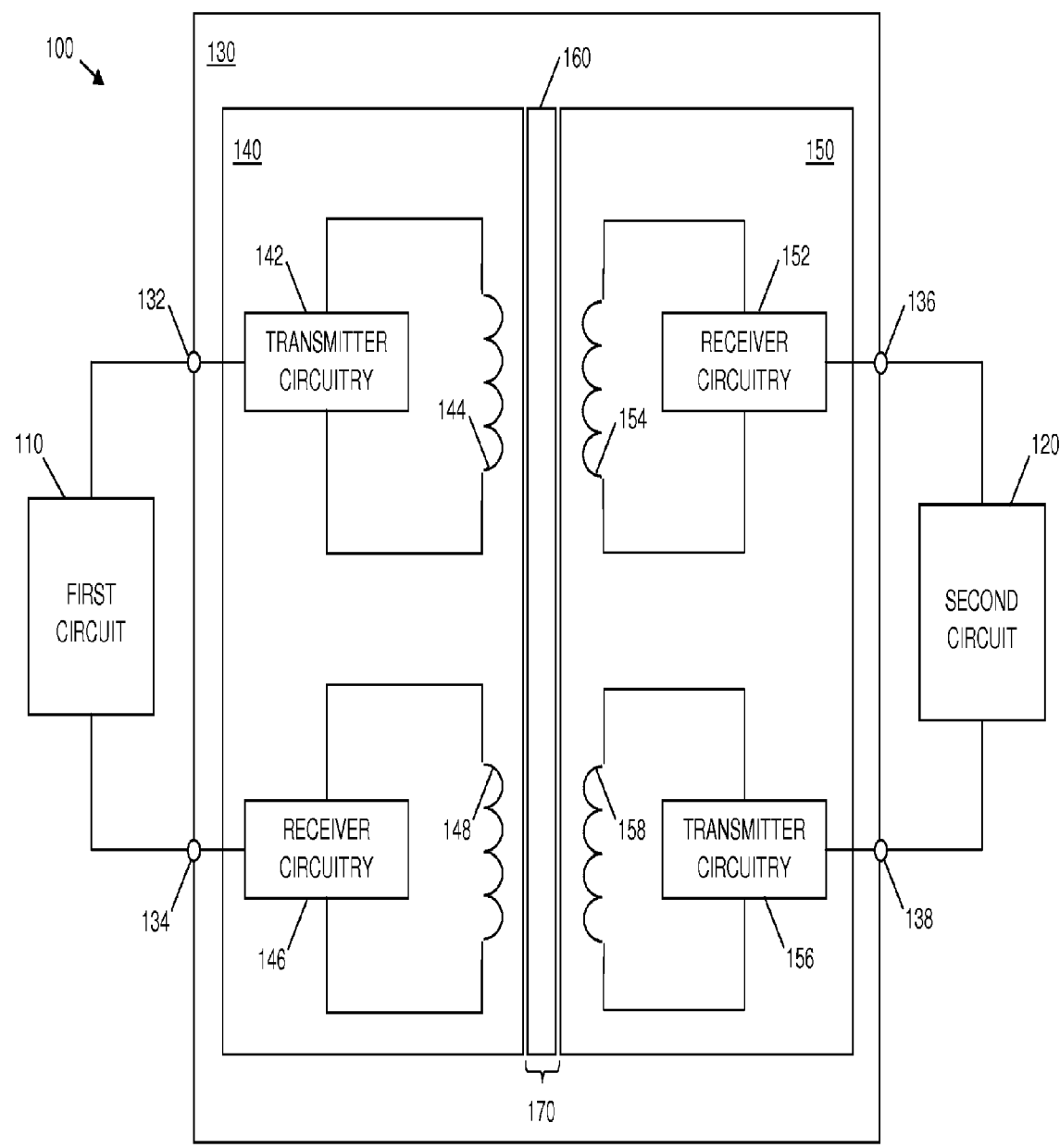
FIG. 1 is a simplified, circuit diagram illustrating a system that includes an inductive communication device that provides galvanic isolation between first and second circuits, according to an example embodiment.

FIG. 1 is a simplified, circuit diagram illustrating a system 100 that includes an inductive communication device 130 that provides galvanic isolation between first and second circuits 110, 120, according to an example embodiment. Accordingly, inductive communication device 130 alternatively may be referred to as a "galvanic isolation device." In system 100, the first circuit 110 may operate at a relatively low supply voltage, and the second circuit 120 may operate at a voltage that is different from the operational voltage for circuit 110, although circuits 110, 120 may use substantially the same operational voltage, as well. In addition or alternatively, the first circuit 110 may be tied to a first voltage reference point (e.g., ground) and the second circuit 120 may be tied to a different voltage reference point (e.g., a floating voltage level), although circuits 110, 120 may be tied to the same voltage reference point, as well. System 100 may, for example, form a portion of a battery charging system for an HEV (e.g., the first circuit 110 may include a control circuit, and the second circuit 120 may include an array of IGBTs and associated gate drivers), a portion of an AC power isolation system, or may form a portion of another type of system in which galvanic isolation between first and second circuits is desired.

The various components of inductive communication device 130 are packaged in a single package (e.g., an overmolded package), in an embodiment. These components include a first integrated circuit (IC) die 140, a second IC die 150, and dielectric material (represented by dielectric structure 160) positioned between the first and second IC die 140, 150. As used herein, "dielectric material" may include a cohesive layer of a single dielectric material, or it may include multiple layers of the same or different dielectric materials. The single dielectric material and the multiple layers of the same or different dielectric materials may be homogeneous materials. They may also be composite materials comprised of particulate filler materials in a matrix of another material, or a fibrous fabric encapsulated by another material, and the like. As will be better illustrated in the Figures that follow, the first and second IC die 140, 150 are physically arranged with respect to each other to provide inductive communication between the first and second IC die 140, 150 across a gap 170, which includes the dielectric material 160. In some embodiments, the dielectric material 160 may substantially fill the gap 170 between the surfaces of the first and second IC die 140, 150. In other embodiments, one or more air gaps may be present within the gap 170 (i.e., the gap 170 may not be completely filled by the dielectric material 160). In such an embodiment, the air gap(s) may be considered to be "dielectric material."

In the embodiment depicted in FIG. 1, the inductive communication device 130 supports bi-directional communication between the circuits 110, 120. More specifically, along a forward communication path between the first circuit 110 and the second circuit 120, the inductive communication device 130 includes first transmitter circuitry 142 and a first (primary) coil 144 within the first IC die 140, and a second (secondary) coil 154 and first receiver circuitry 152 within the second IC die 150. Along a reverse communication path between the second circuit 120 and the first circuit 110, the inductive communication device 130 includes second transmitter circuitry 156 and a third (primary) coil 158 within the second IC die 150, and a fourth (secondary) coil 148 and second receiver circuitry 146 within the first IC die 140. The first and second IC die 140, 150 also may include tuning capacitors (not illustrated) configured to enhance the resonance between primary/secondary coil pairs.

Figure 10:
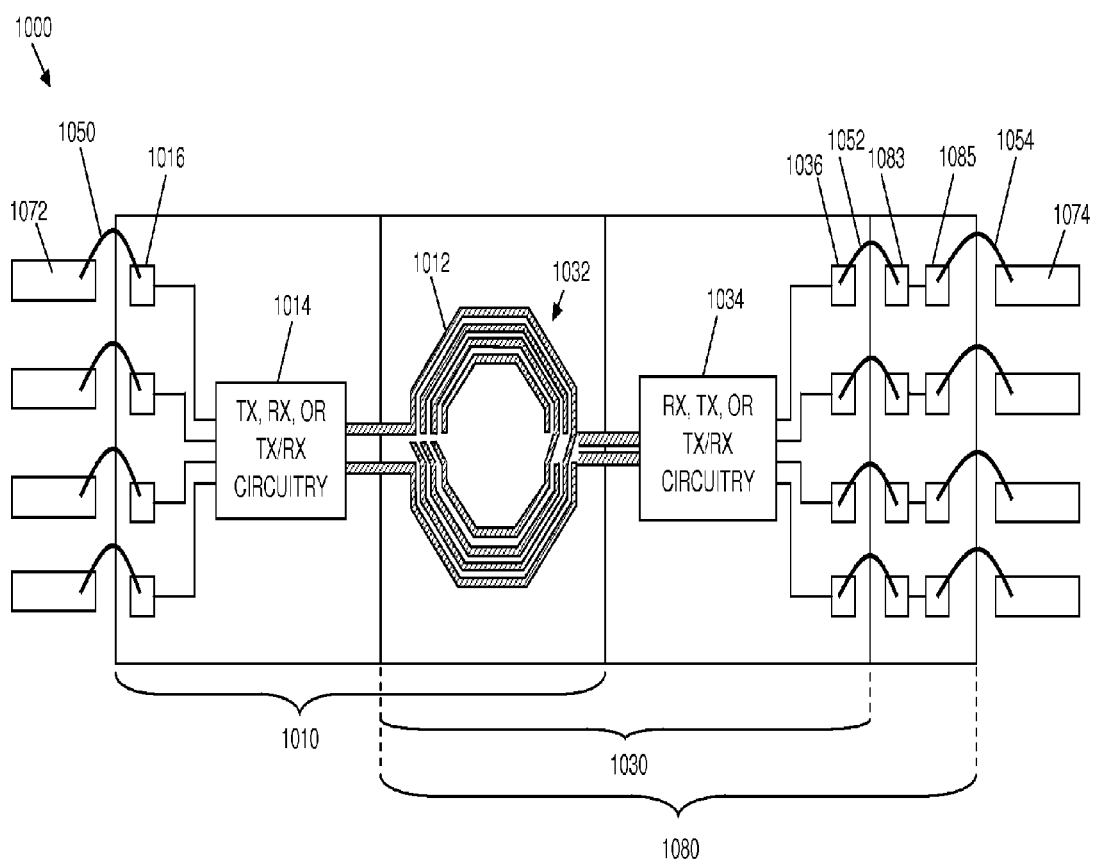
FIG. 10 is a top view of a portion of an inductive communication device that includes a single communication path and a single primary/secondary coil pair, according to an example embodiment.
Figure 11:
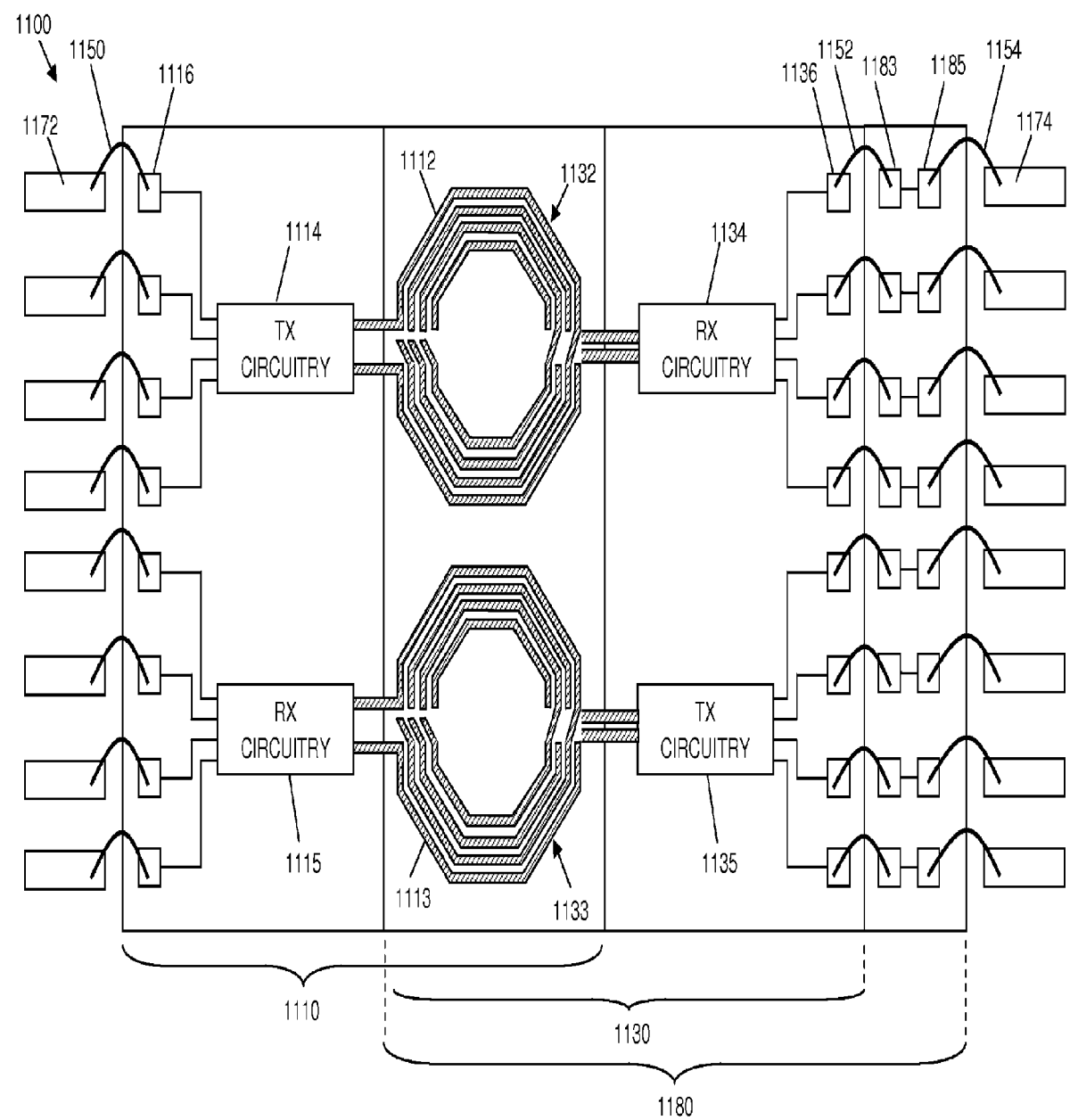
FIG. 11 is a top view of a portion of an inductive communication device with two communications paths, each of which includes a single primary/secondary coil pair, according to an example embodiment.
Figure 12:
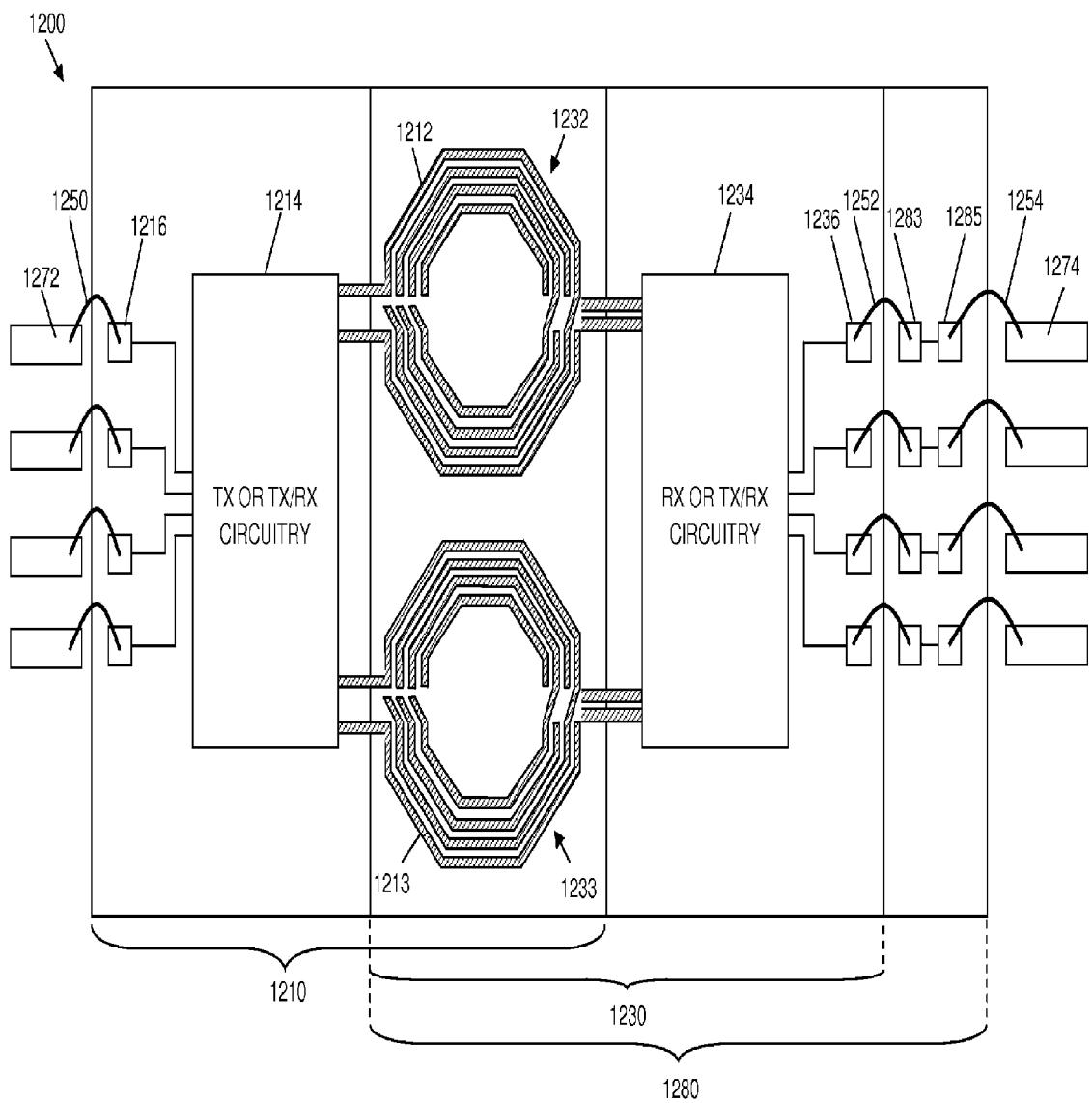
FIG. 12 is a top view of a portion of an inductive communication device with a single communications path, which includes two primary/secondary coil pairs, according to an example embodiment.

Although inductive communication device 130 is shown to provide one forward communication path and one reverse communication path (e.g., as also depicted in FIG. 11), other embodiments of inductive communication devices may provide only one communication path (i.e., only one forward or reverse communication path, such as is depicted in FIG. 10), or multiple communication paths in a particular direction (e.g., multiple forward and/or reverse communication paths, such as is depicted in FIG. 12). Alternatively, one or more of the communication paths may be bi-directional, and each IC die 140, 150 may include transceiver circuitry, rather than transmitter or receiver circuitry. In such an embodiment, communication in a forward or reverse direction may be conducted in a time-duplexed manner, and each of coils 144, 148, 154, 158 may alternate between functioning as a primary coil and a secondary coil. In addition, communication may be conducted in a full duplex manner, in which communication may be conducted simultaneously in a forward and reverse direction between a primary and a secondary coil. Although transceiver-type embodiments are not discussed extensively below, it is to be understood that such embodiments fall within the scope of the inventive subject matter.

In still other alternate embodiments, the transmitter circuitry, receiver circuitry, or transceiver circuitry may be formed on a separate IC from its associated coil. In such embodiments, the IC that includes the coil and the IC that includes the corresponding communication circuitry may both be included within a single packaged device, or may be in distinctly packaged devices.

During operation, transmitter circuitry 142, 156 receives an input signal via input nodes 132, 138, respectively. Transmitter circuitry 142, 156 then converts the input signal into a form that is appropriate for inductive communication by primary coils 144, 158, respectively. More specifically, in an embodiment, each transmitter circuitry 142, 156 provides a time-varying (e.g., oscillating) drive signal (e.g., an alternating current in the form of a sinusoidal wave, a square wave, or another wave pattern) to the primary coil 144, 158 to which it is coupled. The primary coils 144, 158 convert the drive signal into a time-varying magnetic field or flux around the primary coils 144, 158, referred to herein as the "communication signal." The time-varying magnetic field or flux generated by each primary coil 144, 158 extends across the gap 170 through the dielectric material 160 and couples with the corresponding secondary coil 154, 148. More specifically, the communication signal is transmitted from each primary coil 144, 158 to each secondary coil 154, 148 through magnetic inductive coupling between the primary/secondary coil pairs. In response to the communication signal coupling with each secondary coil 148, 154, the secondary coil 148, 154 produces an alternating waveform or voltage, which is received by the receiver circuitry 146, 152 to which each secondary coil 148, 154 is coupled. The receiver circuitry 146, 152 then converts the signal received from the secondary coil 148, 154, respectively, into a reconstructed version of the input signal, and the reconstructed version of the input signal is provided at output nodes 134, 136, respectively, to the first and second circuitry 110, 120.

First transmitter circuitry 142 is coupled between an output of first circuit 110 and primary coil 144, and second transmitter circuitry 156 is coupled between an output of second circuit 120 and primary coil 158. According to an embodiment, and as indicated above, each transmitter circuitry 142, 156 includes an oscillator (not illustrated) and driver circuit (not illustrated) configured to provide the time-varying drive signal to the primary coil 144, 158 to which it is coupled. For example, the driver circuit of transmitter circuitry 142 may receive an input signal from first circuit 110 (e.g., an information-carrying square wave), and may convert the input signal into an alternating signal having characteristics that are conducive to inductive communication between the primary/secondary coil pair 144, 154. According to an embodiment, for example, the driver circuit may implement amplitude-shift keying (ASK) modulation to represent the digital data conveyed in an input signal. More specifically, for example, the driver circuit may implement on-off keying (OOK), in which the driver circuit produces a carrier wave at a frequency established by the oscillator when the input signal has a relatively high logic level (e.g., indicating a binary one), and refrains from producing the carrier wave when the input signal has a relatively low logic level (e.g., indicating a binary zero). In alternate embodiments, the driver circuit may implement other modulation techniques (e.g., frequency modulation, phase modulation or other techniques). According to an embodiment, the carrier wave conveyed within the drive signal may have a frequency in a band of between about 200 megahertz (MHz) and about 400 MHz (e.g., about 300 MHz), although the carrier wave may have higher or lower frequencies in other bands, as well.

First receiver circuitry 152 is coupled between secondary coil 154 and an input to second circuit 120, and second receiver circuitry 146 is coupled between secondary coil 148 and an input to first circuit 110. According to an embodiment, each receiver circuitry 146, 152 includes an amplifier, a detector (not illustrated), and other circuitry configured to convert the time-varying communication signal received from the secondary coil 154, 148 to which it is coupled into a reconstructed version of the signal that was input into the corresponding transmitter circuitry 142, 156 along each communication path.

The dielectric material 160 is positioned between each primary/secondary coil pair (i.e., between coil pair 144, 154 and between coil pair 148, 158). Although a single mass of dielectric material 160 is illustrated, distinct regions of dielectric material may be used, in other embodiments (e.g., one mass of dielectric material for each primary/secondary coil pair), or the dielectric material 160 may be composed of distinct layers with different dielectric properties. The dielectric material 160 provides DC isolation (galvanic isolation) between the first IC die 140 and the second IC die 150, and thus between the first circuit 110 and the second circuit 120. The level of DC isolation provided is affected by the thickness and intrinsic properties of the dielectric material 160, level of water absorption of the dielectric, geometric characteristics of the electrodes, rate of voltage change across the dielectric, temperature, and other material characteristics such as microstructure/microstructural defects, and material homogeneity/inhomogeneity, and the dielectric constant(s) of the component(s) that make up the dielectric material 160. For example, the dielectric material 160 may be configured to provide DC isolation in a range of about 1.0 kilovolts (kV) to about 4.0 kV, or more desirably from about 2.0 kV to about 5.0 kV, although dielectric material 160 may be configured to provide more or less DC isolation, as well.

Figure 2:
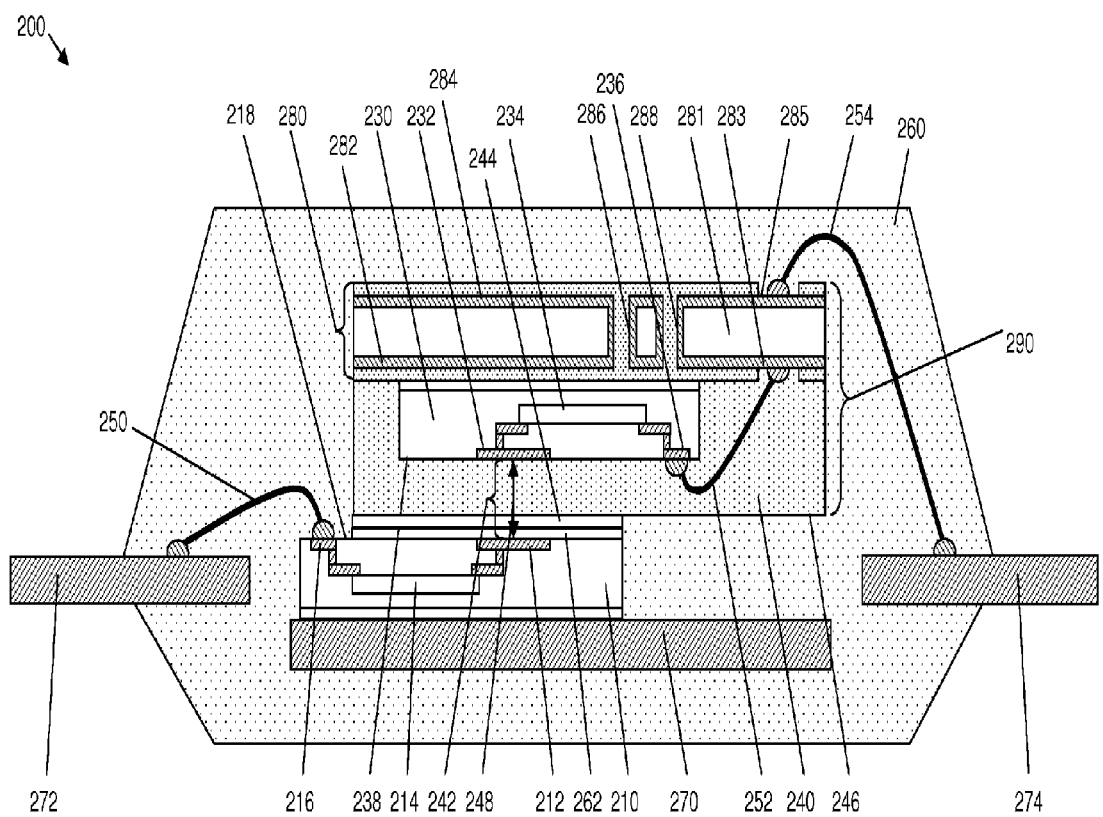
FIG. 2 is a cross-sectional, side view of an inductive communication device, according to an example embodiment.

Various embodiments of inductive communication devices (e.g., device 130) will now be described in more detail. For example, FIG. 2 is a cross-sectional, side view of an inductive communication device 200 (e.g., inductive communication device 130, FIG. 1), according to an example embodiment. Inductive communication device 200 includes a first IC die 210 coupled to a first substrate 270 (referred to herein as "device substrate"), a second IC die 230 coupled to a second substrate 280 (referred to herein as an "interposer substrate"), inner encapsulant 240, adhesive layer(s) 244, a plurality of package leads 272, 274, a plurality of wirebonds 250, 252, 254, and outer encapsulant 260, in an embodiment. Because the electrical components of inductive communication device 200 are housed in the outer encapsulant 260, inductive communication device 200 is considered to be an overmolded device. In an alternate embodiment, the outer encapsulant 260 may be replaced by structures that correspond to an air-cavity package (i.e., a package in which die 210, 230, interposer substrate 280, inner encapsulant 240, and wirebonds 250, 252, 254 are located within an air cavity within the package, where the air cavity is typically sealed with a lid).

First IC die 210 includes at least one coil 212 (e.g., a primary coil 144, 158 or secondary coil 148, 154, FIG. 1), at least one instantiation of communication circuitry 214 (e.g., transmitter circuitry 142, 156, receiver circuitry 146, 152, FIG. 1, or transceiver circuitry), a plurality of bond pads 216 (only one of which is shown), and various conductive traces and vias interconnecting the coil(s) 212, communication circuitry 214, and bond pads 216. In an alternate embodiment, as mentioned previously, the communication circuitry 214 may be included in a separate die within the same package as the die that contains the coil 212, or the communication circuitry 214 may be separately packaged. In any of the above-described embodiments, the bond pads 216 may be considered to be electrically coupled to the coil 212 (e.g., either directly or indirectly through communication circuitry 214).

Similarly, second IC die 230 includes at least one coil 232 (e.g., a primary coil 144, 158 or secondary coil 148, 154, FIG. 1), at least one instantiation of communication circuitry 234, a plurality of bond pads 236 (only one of which is shown), and various conductive traces and vias interconnecting the coil(s) 232, communication circuitry 234, and bond pads 236. As was the case with the first IC die 210, in an alternate embodiment, the communication circuitry 234 may be included in a separate die within the same package as the die that contains the coil 232, or the communication circuitry 234 may be separately packaged. In whichever embodiment, the bond pads 236 may be considered to be electrically coupled to the coil 232 (e.g., either directly or indirectly through communication circuitry 234).

One of coils 212, 232 may function as a primary coil, and the other of coils 212, 232 may function as a secondary coil, or both coils 212, 232 may function as a primary and a secondary coil at alternating times (e.g., in a transceiver-type embodiment). Either way, coils 212, 232 each are proximate to a surface 218, 238 of the IC die 210, 230 in which they are included. As used herein, the term "proximate to a surface," when referring to the position of a coil, means that a portion of the coil is either exposed at the surface, or that one or more non-conductive layers of material (e.g., oxide layers) is disposed over the coil, where the surface of the non-conductive layer(s) of material establishes the surface of the IC.

In any event, the surfaces 218, 238 of the first and second IC die 210, 230 to which the coils 212, 232 are proximate are arranged to face each other within device 200 so that the coils 212, 232 are aligned with each other across a gap that is established by a portion of encapsulant 240 that is present between the coils 212, 232, and by adhesive material in the form of one or more adhesive layers 244. In one embodiment, one or more additional layers of dielectric material may be included between the coils 212, 232, as indicated by layer 262. The additional layer(s) may be coupled to the surface 218 of the first IC die 210 (as shown), the second IC die 230, or both, in various embodiments. In any event the additional dielectric material layer(s) are formed from a material (e.g., benzocyclobuten (BCB) or another suitable material) having a dielectric strength that is sufficient to provide sufficiently high voltage isolation. The combination of materials in the gap is referred to herein as "inter-coil dielectric material 242," which in the embodiment of FIG. 2 includes the adhesive layer(s) 244 the portion of encapsulant 240 located directly between the coils 212, 232, and the additional dielectric layer(s) 262, if included. In other embodiments, the "inter-coil dielectric material 242" may include additional or different materials. The alignment of the coils 212, 232 across the gap enables inductive communication to occur between the coils 212, 232.

The inter-coil dielectric material 242 is positioned within the gap directly between the coils 212, 232, and extends laterally beyond the coils 212, 232. The level of galvanic isolation between the coils 212, 232 (and thus the IC die 210, 230) is directly related to the thickness 248 of the inter-coil dielectric material 242 (or the vertical distance between coils 212, 232, which is the width of the gap between the coils 212, 232) and the materials composing the inter-coil dielectric material 242 (e.g., the material of encapsulant 240 and adhesive layer(s) 244). In other embodiments, besides a portion of encapsulant 240 and the adhesive layer(s) 244, other dielectric components (including an air gap) may be present within the gap between the coils 212, 232, as well. According to an embodiment, the inter-coil dielectric material 242 may have a total thickness 248 in a range of about 25 micrometers to about 400 micrometers, or more desirably from about 200 micrometers to about 300 micrometers, although the inter-coil dielectric material 242 may be thinner or thicker, as well. Encapsulant 240 has a substantially planar surface 246 above the surface 238 of the second IC die 230, and the thickness of the encapsulant 240 between the surface 238 of IC die 230 and the surface 246 of the encapsulant 240 may be in a range of about 150 micrometers to about 250 micrometers. Further, the thickness of adhesive layer(s) 244 may be in a range of about 20 micrometers to about 60 micrometers, although the encapsulant 240 and adhesive layer 244 thicknesses may be smaller or larger, as well. Further, although a single adhesive layer 244 is shown, adhesive layer 244 may include one or multiple layers formed from one or multiple adhesives.

The overall or average dielectric constant of the inter-coil dielectric material 242 may be in a range of about 2.0 to about 5.0, although inter-coil dielectric material 242 (or its constituent parts) may have a lower or higher dielectric constant, as well. According to an embodiment, the encapsulant 240 includes a molding encapsulant polymer or thermoset plastic, such as an orthocresol-novolac epoxy, a bisphenol-epichlorohydrin epoxy, a biphenyl epoxy resin system, a multi-aromatic resin epoxy resin system, or another suitable material, which may include one or more additives such as silica, carbon black, antimony, bromine, silicone elastomer, alumina particles, aluminum nitride particles, was, adhesion promoter, and so on. According to a further embodiment, the adhesive layer(s) 244 may include one or more layers of organic and/or inorganic materials, including BCB, polyimide, polybenzoxazole (PBO), SU-8 photo-resist, epoxy resins, and other suitable materials.

The first IC die 210 is coupled to device substrate 270 with solder, a die bond adhesive, or another suitable material. According to an embodiment, device substrate 270 may form a portion of a lead frame that also includes package leads 272, 274. As will be discussed in more detail later, to support parallel fabrication of multiple instances of device 200, the lead frame may be part of a lead frame strip or array, which includes multiple instances of device substrate 270 and leads 272, 274 that are held together with supporting tie-bars. Ultimately, each device 200 is separated from the other devices 200 during fabrication (e.g., by removing the supporting tie-bars in block 518, FIG. 5). For clarity, however, only one instance of device 200 is shown in FIG. 2, and fabrication of only one instance of device 200 is depicted in the Figures and discussed in detail below.

According to an embodiment, device substrate 270 and leads 272, 274 may be formed from bulk conductive material (e.g., copper or another conductive material). Alternatively, device substrate 270 may be formed from a non-conductive material, or may be a multi-layer substrate that includes both conductive and non-conductive layers.

In the illustrated embodiment, the device substrate 270 and leads 272, 274 are not co-planar, and the leads 272, 274 may extend from the sides of device 200 at locations that are between the bottom and top surfaces of the device 200. In an alternate embodiment, the device substrate 270 and leads 272, 274 may be co-planar. Further, although leads 272, 274 are shown to extend outward from the sides of the device 200, leads 272, 274 may be substantially shorter (e.g., they may be configured for a flat no-leads type of package, such as a no-leads package with an up-set flag). In still other embodiments, leads 272, 274 may be bent (e.g., leads 272, 274 may be gull-wing leads).

The second IC die 230 forms a portion of a molded sub-assembly 290 (e.g., sub-assembly 290, FIG. 8), in an embodiment. The sub-assembly 290 includes interposer substrate 280, the second IC die 230, encapsulant 240, and wirebonds 252. Interposer substrate 280 includes at least two conductive layers 282, 284, in an embodiment, that are proximate to first and second opposed surfaces of the interposer substrate 280. In addition, interposer substrate 280 includes at least one dielectric layer 281 that electrically isolates the conductive layers 282, 284. Conductive vias 286, 288 through the dielectric layer(s) 281 provide for electrical interconnection between features of the conductive layers 282, 284, and thus provide for electrical connectivity between the opposed surfaces of the interposer substrate 280. In an alternate embodiment, the dielectric layer 281 includes an opening (not shown) that exposes the inner surface of conductive layer 282 (i.e., the surface of conductive layer 282 that contacts dielectric layer 281). In such an embodiment, wirebond 254 (described below), may extend through the opening in dielectric layer 281 to contact the inner surface of conductive layer 282. Further, in such an embodiment, conductive layer 284 and conductive vias 286, 288 may be excluded from the interposer substrate 280. Alternatively, wirebond 252 (described below) may extend through an opening in dielectric layer 281 that exposes the inner surface of conductive layer 284 in a similar manner.

Second IC die 230 is coupled to a surface of the interposer substrate 280 with solder, a die bond adhesive, or another suitable material. Wirebonds 252 are connected between conductive pads 236 of the second IC die 230 and bond pads 283, which may be exposed portions of conductive layer 282. Non-conductive encapsulant 240 covers the second IC die 230, the wirebonds 252, and the die-side surface of the interposer substrate 280. For efficiency, an array or strip of multiple instances of sub-assembly 290 can be formed on a common substrate, and the distinct sub-assemblies may be separated from the array or strip using a singulation process (e.g., sawing or laser cutting, as in block 510 of FIG. 5).

Surface 246 of sub-assembly 290 is coupled to surface 218 of the first IC die 210 with the adhesive layer(s) 244. More specifically, portions of the surfaces 218, 238 of the first and second IC die 210, 230 overlap to allow the coils 212, 232 to be aligned with each other in the horizontal direction across the inter-coil dielectric material 242.

The bond pads 216 of the first IC die 210 are coupled to leads 272 extending from a first side of the device 200 via wirebonds 250. In addition, bond pads 285 on the non-die side of the interposer substrate 280, which may be portions of conductive layer 284, are coupled to leads 274 extending from a second side of the device 200 via wirebonds 254. Leads 272, 274 may correspond to an input node and an output node of device 200. More specifically, one of leads 272, 274 may correspond to one of input nodes 132, 138 (FIG. 1), and the other one of leads 272, 274 may correspond to one of output nodes 134, 136 (FIG. 1).

According to an embodiment, portions of sub-assembly 290, portions of the first IC 210, wirebonds 250, 254, portions of the top surface of device substrate 270, and portions of leads 272, 274 are covered with non-conductive encapsulant 260, which at least partially defines an exterior of device 200. Encapsulant 260 may be formed from the same material as encapsulant 240, or encapsulant 240, 260 may be formed from different materials.

The cross-sectional view illustrated in FIG. 2 depicts a single communication path between leads 272, 274. For example, the direction of the communication path may be from lead 272 to lead 274. In such a case, communication circuitry 214 of the first IC die 210 may be transmitter circuitry (e.g., transmitter circuitry 142 or 156, FIG. 1), and the coil 212 of the first IC die 210 may be a primary coil (e.g., primary coil 144 or 158, FIG. 1). Conversely, communication circuitry 234 of the second IC die 230 may be receiver circuitry (e.g., receiver circuitry 146 or 152, FIG. 1), and the coil 232 of the second IC die 230 may be a secondary coil (e.g., secondary coil 148 or 154, FIG. 1). Alternatively, the direction of the communication path may be from lead 274 to lead 272. In this case, communication circuitry 234 of the second IC die 230 may be transmitter circuitry (e.g., transmitter circuitry 142 or 156, FIG. 1), and the coil 232 of the second IC die 230 may be a primary coil (e.g., primary coil 144 or 158, FIG. 1). Conversely, communication circuitry 214 of the first IC die 210 may be receiver circuitry (e.g., receiver circuitry 146 or 152, FIG. 1), and the coil 212 of the first IC die 210 may be a secondary coil (e.g., secondary coil 148 or 154, FIG. 1). Alternatively, communication circuitry 214, 234 may be transceiver circuitry, which may function as both transmitter circuitry and receiver circuitry in a time-duplexed manner. In such an embodiment, each of coils 212, 232 may alternate between functioning as a primary coil and a secondary coil. Although only a single communication path is depicted in FIG. 2, inductive communication device 200 also may include one or more additional communication paths in the same direction and/or the opposite direction as the communication path depicted in FIG. 2, as will be described and depicted in more detail in conjunction with FIGS. 11 and 12.

Figure 3:
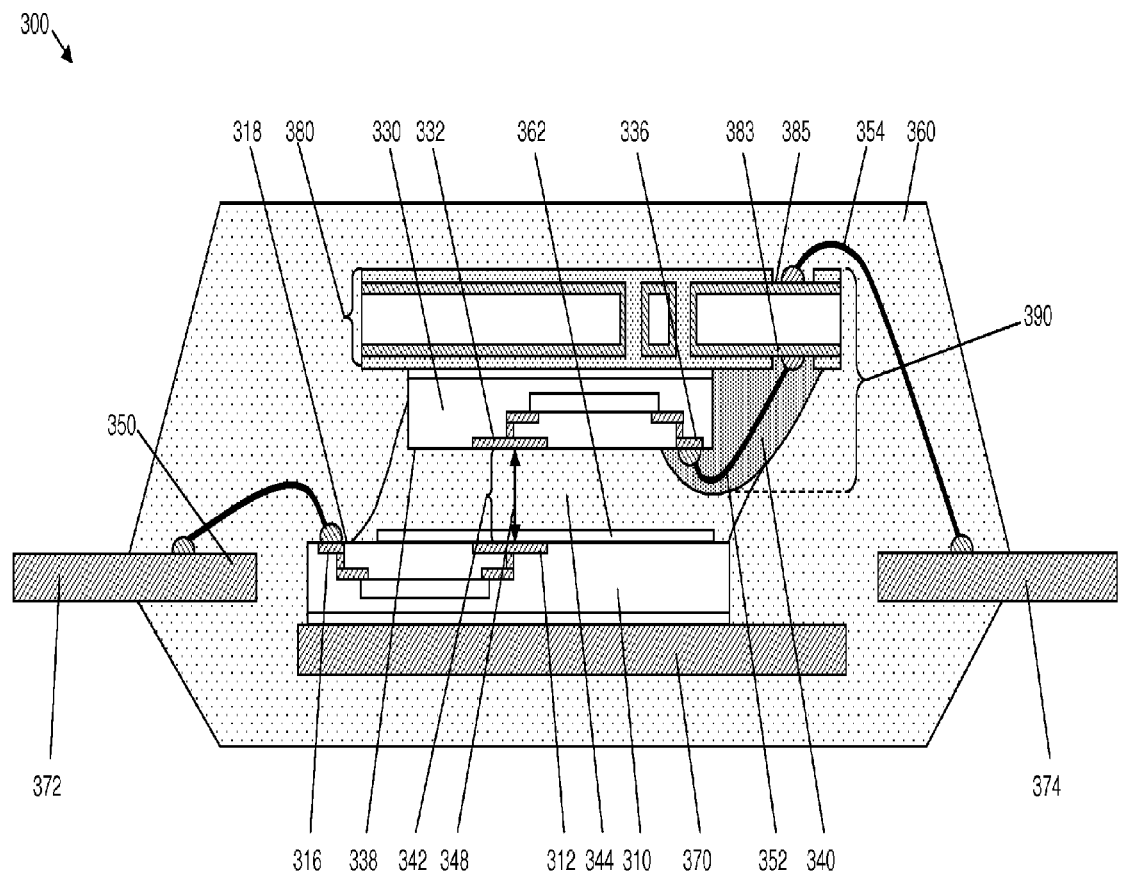
FIG. 3 is a cross-sectional, side view of an inductive communication device, according to another example embodiment.

FIG. 3 is a cross-sectional, side view of an inductive communication device 300, according to another example embodiment. Inductive communication device 300 is similar to inductive communication device 200 (FIG. 2), in that inductive communication device 300 also includes a first IC die 310 coupled to a device substrate 370, a second IC die 330 coupled to an interposer substrate 380, a plurality of package leads 372, 374, a plurality of wirebonds 350, 352, 354, and encapsulant 360, in an embodiment. First IC die 310, second IC die 330, device substrate 370, interposer substrate 380, leads 372, 374, wirebonds 350, 352, 354, and encapsulant 360 may be substantially similar to their corresponding counterparts in FIG. 2, including alternate embodiments of those elements of the device. Accordingly, and for the purpose of brevity, first IC die 310, second IC die 330, device substrate 370, interposer substrate 380, leads 372, 374, wirebonds 350, 352, 354, and encapsulant 360 are not discussed in detail in conjunction with FIG. 3.

Inductive communication device 300 differs from inductive communication device 200 (FIG. 2) in that the sub-assembly 390 that includes the second IC die 330 is differently configured from molded sub-assembly 290 of FIG. 2. In addition, sub-assembly 390 is coupled differently to the first IC die 310 than the manner in which the molded sub-assembly 290 of FIG. 2 is coupled to first IC die 210.

Similar to molded sub-assembly 290, sub-assembly 390 also includes the second IC die 330 coupled to interposer substrate 380, and wirebonds 354 coupled between bond pads 336 of the second IC die 330 and bond pads 383 of the interposer substrate 380. In addition, wirebonds 354 similarly couple bond pads 385 of the interposer substrate 380 with leads 374. However, sub-assembly 390 differs from molded sub-assembly 290 in that sub-assembly 390 is not fully over-molded (e.g., with encapsulant 240, FIG. 2). Instead, encapsulant 340 only partially covers sub-assembly 390. For example, encapsulant 340 may cover sub-assembly 390 in what is colloquially referred to as a "glob top" configuration, in which the encapsulant 340 covers only wirebonds 352, a portion of surface 338 of the second IC die 330, and a portion of the surface of interposer substrate 380 that includes bond pads 383. According to an embodiment, the encapsulant 340 includes a curable epoxy, which is typically loaded with a filler material such as silica, or another suitable material, such as polyurethane, acrylic-modified epoxy, imidized epoxy, or another appropriate polymer material, which also may be loaded with a filler such as silica, and may also include spacer beads of specified dimensions.

Also similar to inductive communication device 200, in inductive communication device 300, the surfaces 318, 338 of the first and second IC die 310, 330 to which the coils 312, 332 are proximate are arranged to face each other within device 300 so that the coils 312, 332 are aligned with each other across a gap. However, in contrast with inductive communication device 200, the gap is established and maintained with non-conductive adhesive material 344 that couples sub-assembly 390 to the surface 318 of the first IC die 310. For example, the adhesive material 344 may include a curable epoxy, which is typically loaded with a filler material such as silica, or another suitable material, such as polyurethane, acrylic-modified epoxy, imidized epoxy, or another appropriate polymer material, which also may be loaded with a filler such as silica, and may also include spacer beads of specified dimensions.

In the embodiment of FIG. 3, the inter-coil dielectric material 342 essentially consists of the adhesive material 344 located directly between the coils 312, 332. In an alternate embodiment, one or more additional layers of dielectric material may be included between the coils 312, 332, as indicated by layer 362. The additional layer(s) may be coupled to the surface 318 of the first IC die 310 (as shown), the second IC die 330, or both, in various embodiments. In any event the additional dielectric material layer(s) are formed from a material (e.g., BCB or another suitable material) having a dielectric strength that is sufficient to provide sufficiently high voltage isolation. Accordingly, the level of galvanic isolation between the coils 312, 332 (and thus the IC die 310, 330) is directly related to the total thickness 348 and material properties of the adhesive material 344 and the additional dielectric layer(s) 362, in included. According to an embodiment, between coils 312, 332, the total thickness 348 is in a range of about 35 micrometers to about 400 micrometers, or more desirably from about 200 micrometers to about 300 micrometers, although the thickness 348 may be larger or smaller, as well. Further, the dielectric constant of the adhesive material 344 may be in a range of about 3.0 to about 5.0, although the adhesive material 344 may have a lower or higher dielectric constant, as well.

Figure 4:
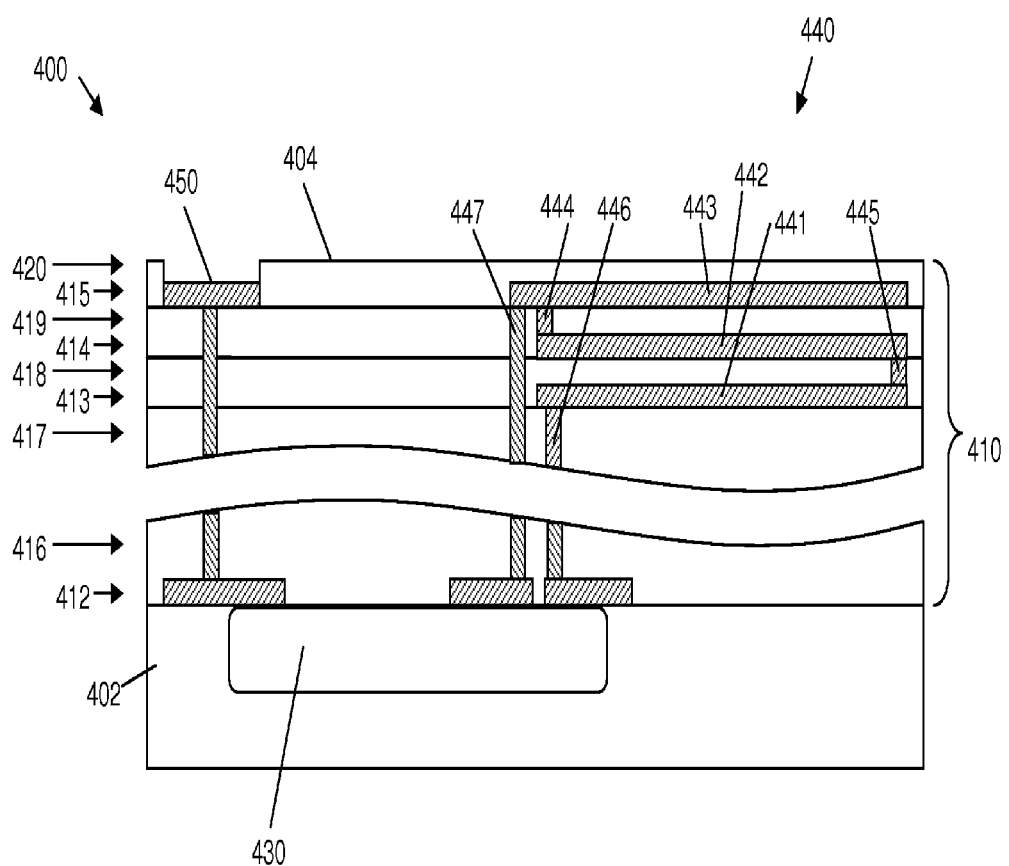
FIG. 4 is a cross-sectional, side view of an integrated circuit die that may be used in an inductive communication device, according to an example embodiment.

A more detailed example of an embodiment of an IC die (e.g., IC die 210, 230, 310, and 330) will now be described in conjunction with FIG. 4. More particularly, FIG. 4 is a cross-sectional, side view of an IC die 400 that may be used as the first or second IC die 210, 230, 310, 330 in the inductive communication devices 200, 300 of FIGS. 2 and 3, according to an example embodiment. IC die 400 includes a semiconductor substrate 402, and a build-up structure 410 comprising a plurality of conductive layers 412, 413, 414, 415 and dielectric layers 416, 417, 418, 419, 420 on a top surface of the semiconductor substrate 402. Various active components forming communication circuitry 430 are formed in the semiconductor substrate 402. For example, the communication circuitry 430 may be transmitter circuitry (e.g., transmitter circuitry 142 or 156, FIG. 1), receiver circuitry (e.g., receiver circuitry 146 or 152, FIG. 1) or transceiver circuitry, in various embodiments. The components of the communication circuitry 430 are interconnected through conductive traces (not illustrated) formed in some or all of the conductive layers 412-415 and conductive vias (not illustrated) formed between the conductive layers 412-415. At least one bond pad 450 may be formed in an uppermost conductive layer 415, and the bond pad 450 may be electrically coupled to the communication circuitry 430 through conductive vias formed through the dielectric layers 416-419 and conductive traces formed between the vias in the conductive layers 412-415. When IC die 400 is incorporated into an inductive communication device (e.g., device 130, 200, 300, FIGS. 1-3), a wire bond (e.g., wirebond 250, 252, 350, 352, FIGS. 2, 3) may be coupled between the bond pad 450 and either a device lead (e.g., lead 272, 372, FIGS. 2, 3) or a bond pad on an interposer substrate (e.g., bond pad 283, 383 on interposer substrate 280, 380, FIGS. 2, 3). For example, bond pad 450 may correspond to a bond pad configured to receive a communication signal from external circuitry or to provide a communication signal to external circuitry (e.g., to bond pad 216, 236, 316, or 336, FIGS. 2, 3).

In addition, IC die 400 includes a coil 440 (e.g., one of coils 144, 148, 154, 158, 212, 232, 312, 332, FIGS. 1-3), which includes multiple substantially-concentric conductive rings 441, 442, 443 formed in one or more uppermost conductive layers 413-415 (i.e., formed proximate to the top surface 404 of IC die 400). For example, in the embodiment illustrated in FIG. 4, coil 440 includes conductive rings formed in the uppermost three conductive layers 413-415. The conductive rings in the various layers 413-415 are interconnected through conductive vias 444, 445 to form a continuous conductive coil having first and second ends that are electrically coupled to the communication circuitry 430. For example, a first end of the coil 440 may be coupled to the communication circuitry 430 through conductive via 446 and other conductive structures (not illustrated) between the coil 440 and the communication circuitry 430, and a second end of the coil 440 may be coupled to the communication circuitry 430 through conductive via 447 and still other conductive structures (not illustrated) between the coil 440 and the communication circuitry 430. In other embodiments, coil 440 may be formed using fewer or more than three conductive layers, and/or the ends of coil 440 may be located on a same conductive layer. In addition, the location of vias 444, 445 shown interconnecting the concentric conductive rings 441-443 may be located in other positions, and/or multiple vias may be used to provide a plurality of cross-overs used to construct the continuous coil 440.

An uppermost dielectric layer 420 may or may not overlie the coil 440, in various embodiments. In an embodiment in which the uppermost dielectric layer 420 does overlie the coil 440 (e.g., the embodiment illustrated in FIG. 4), the height of the portion of the uppermost dielectric layer 420 overlying the coil 440 contributes to the thickness of the gap (e.g., thickness 248, 348 of the gap, FIGS. 2, 3) between the IC die 400 and a second IC die (not illustrated) that is aligned with the IC die 400 in the inductive communication device. In addition, the portion of the uppermost dielectric layer 420 overlying the coil 440 may contribute to the overall level of galvanic isolation between IC 400 and the second IC, when arranged according to the embodiments discussed herein.

In the embodiments depicted in the Figures, various relative orientations of coils, communication circuitry, and bond pads are conveyed. More particularly, in each of the embodiments depicted in Figures, the coils, communication circuitry, and bond pads are shown to be positioned in spatially separated portions of the respective IC die. It should be understood that, in alternate embodiments, the communication circuitry and bond pads of an IC die may be positioned in any suitable position with respect to the coil(s) of that IC die. For example, but not by way of limitation, all or portions of the communication circuitry may be placed below and/or in the center of a coil. Any suitable relative orientation of coils, communication circuitry, and bond pads is intended to be included within the scope of the inventive subject matter.

Figure 5:
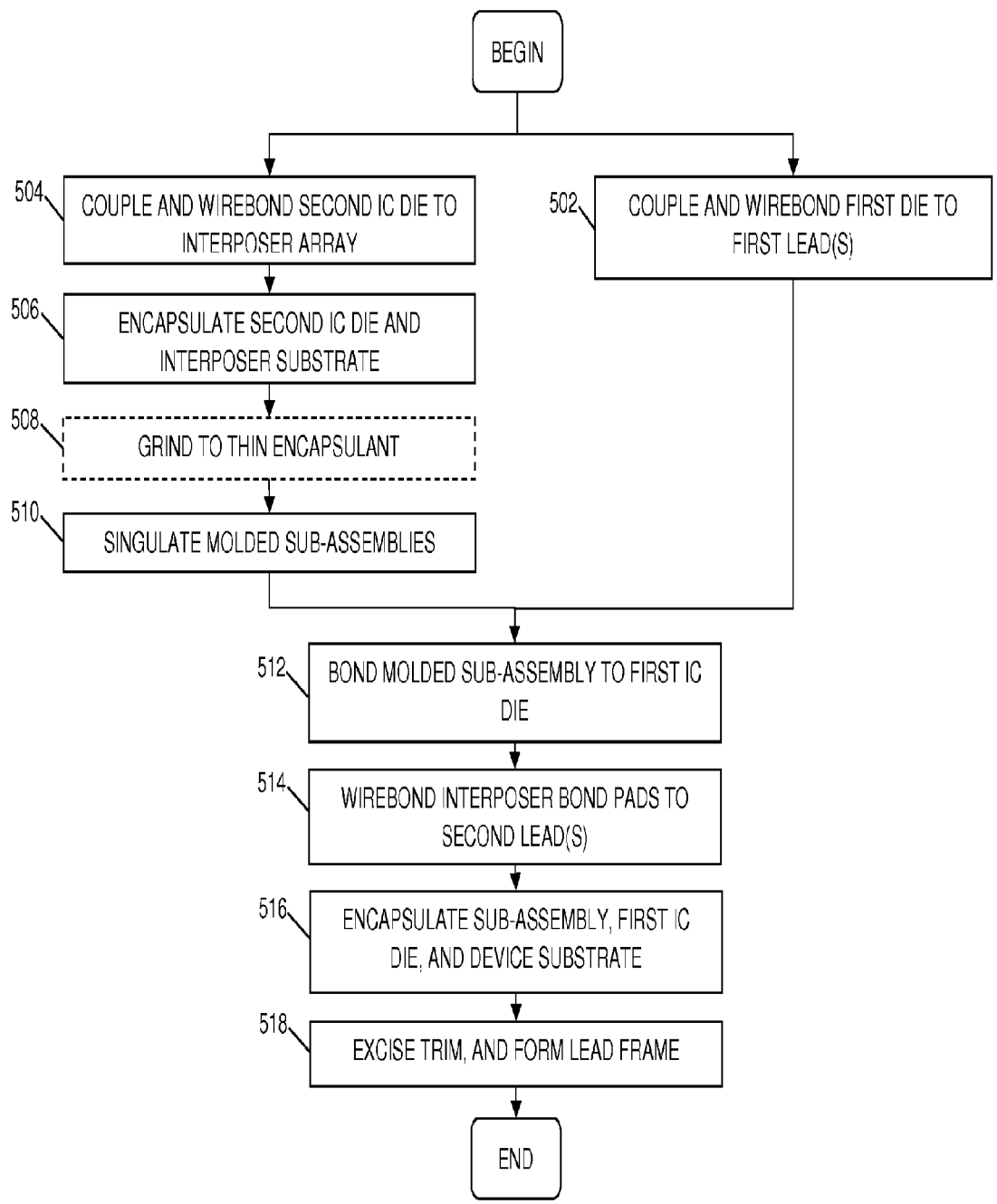
FIG. 5 is a flowchart of a method for manufacturing an inductive communication device, according to an example embodiment.
Figure 6:
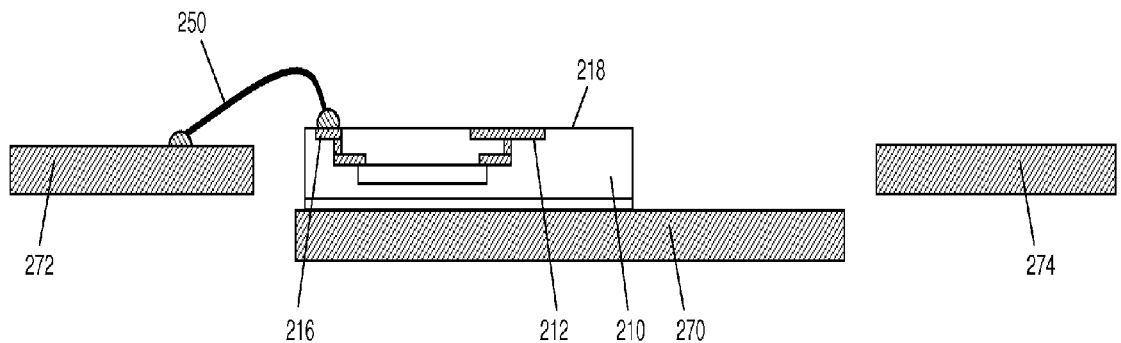
FIGS. 6-9 are cross-sectional, side views of the inductive communication device of FIG. 2 at various stages of manufacture, according to an example embodiment.

FIG. 5 is a flowchart of a method for manufacturing inductive communication devices (e.g., device 200, 300, and 1000-1200, FIGS. 2, 3, and 10-12), according to an example embodiment. The flowchart of FIG. 5 should be viewed in conjunction with FIGS. 6-9, which are cross-sectional, side views of an IC die 400 that may be used in an inductive communication device, and additional cross-sectional, side views of the inductive communication device of FIG. 2 at various stages of manufacture, according to an example embodiment. Although specific cross-sectional drawings relating to different features of the inductive communication device of FIG. 3 are not illustrated in conjunction with the description of the manufacturing method, fabrication of those different features also are discussed below.

The method may begin by performing block 502 or the sequence of blocks 504-510 in either order or in parallel. Beginning first with block 502 and referring also to FIG. 6, a first IC die 210 is coupled to a device substrate 270 so that a surface 218 of the die 210 to which coil 212 is proximate faces upward. For example, the first IC die 210 may be coupled to the substrate 270 using solder, a die bond adhesive, or another suitable material. As discussed previously, device substrate 270 may form a portion of a lead frame that also includes leads 272, 274, and multiple instances of device 200 may be fabricated in parallel.

At this stage, wirebonds 250 may be coupled between bond pads 216 of the first IC die 210 and leads 272. In an alternate embodiment, wirebonds 250 may be coupled between bond pads 216 and leads 272 at a later fabrication stage (e.g., in conjunction with coupling wirebonds 254 in block 514).

Figure 7:
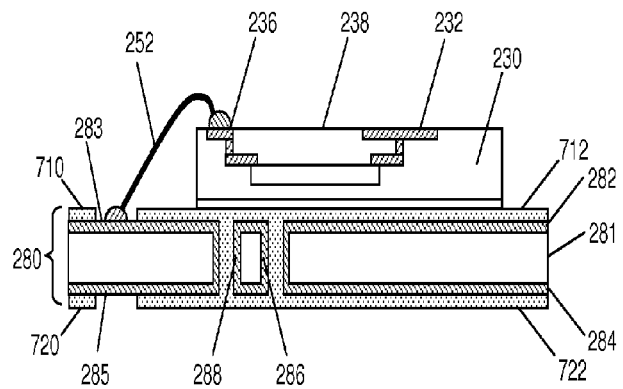

In blocks 504-510, a molded sub-assembly 290 is formed. Referring also to FIG. 7, formation of the molded sub-assembly 290 begins in block 504 by coupling a second IC die 230 to a first surface 710 of an interposer substrate 280 so that a surface 238 of the die 230 to which coil 232 is proximate faces upward. For example, the second IC die 230 may be coupled to the interposer substrate 280 using solder, a die bond adhesive, or another suitable material. As discussed previously, interposer substrate 280 may form a portion of a common substrate that includes an array or strip of multiple instances of interposer substrate 280, where molded sub-assemblies 290 that are formed in parallel with the common substrate may be separated during a subsequent singulation process (e.g., in block 510, described below).

As discussed previously, the interposer substrate 280 includes at least two conductive layers 282, 284 that are proximate to the first and second surfaces 710, 720 of the interposer substrate 280. In addition, interposer substrate 280 includes at least one dielectric layer 281 that electrically isolates the conductive layers 282, 284. Conductive vias 286, 288 through the dielectric layer(s) 281 provide for electrical interconnection between features of the conductive layers 282, 284 (e.g., electrical interconnection between bond pads 283, 285). In addition, the interposer substrate 280 may include a first dielectric layer 712 over conductive layer 282, where the first dielectric layer 712 electrically insulates the second IC die 230 from conductive layer 282, and the first dielectric layer 712 includes openings that expose bond pads 283. Similarly, the interposer substrate 280 may include a second dielectric layer 722 over conductive layer 284, where the second dielectric layer 722 includes openings that expose bond pads 285. Wirebonds 252 are coupled between bond pads 236 of the second IC die 230 and bond pads 283 that are exposed at the first surface 710 of the interposer substrate 280.

Figure 8:
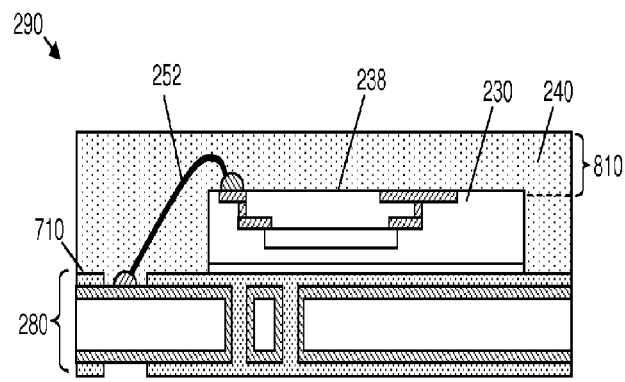

Referring also to FIG. 8, formation of the molded sub-assembly 290 continues in block 506 by encapsulating the second IC die 230, wirebonds 252, and interposer substrate 280. According to an embodiment, encapsulation may include performing a transfer molding process using a curable molding compound (e.g., a molding encapsulant polymer system or thermoset plastic system) that is applied over an entirety of the top surface 710 of the interposer substrate 280, the second IC die 230, and wirebonds 252, and then cured. In block 508, a grinding process optionally may be performed (as indicated by the dashed box) on the top surface of the encapsulant, resulting in encapsulant 240 with a desired thickness 810 over the top surface 238 of the second die 230 (i.e., a thickness that results in a desired gap width 248 when the encapsulant 240 later is coupled to the first IC die 210). If the encapsulation process performed in block 506 is configured to yield encapsulant with the desired thickness 810, block 508 may be excluded from the process. As discussed in conjunction with FIG. 3, in an alternate embodiment, the interposer substrate (e.g., interposer substrate 380), second IC die (e.g., second IC die 330), and wirebonds (e.g., wirebonds 352) may be only partially encapsulated (e.g., using encapsulant 340).

In an embodiment in which multiple molded sub-assemblies are formed on a common substrate, a singulation process is performed in block 510 to produce multiple instances of sub-assembly 290. For example, the singulation process may include mechanically sawing or laser cutting through the encapsulant 240 and interposer substrate 280 along saw streets between the sub-assemblies.

Figure 9:
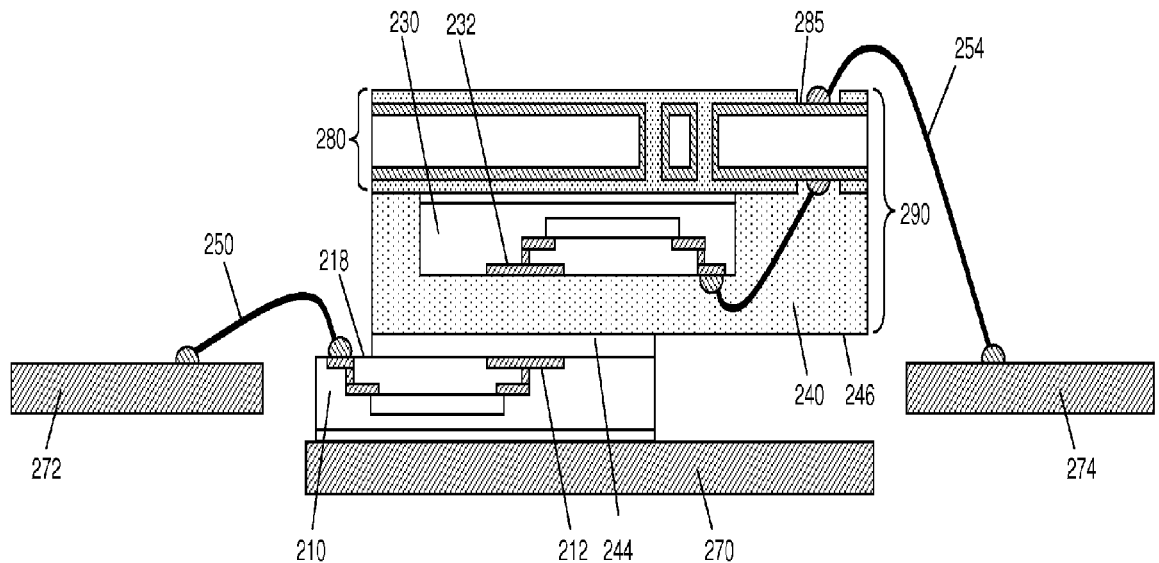

Referring now to FIG. 9, the molded sub-assembly 290 is flipped and bonded to surface 218 of the first IC die 210 in block 512. For example, one or more adhesive layers and/or materials 244 and, in some embodiments, additional dielectric layer(s) 262 may be applied to the surface 218 of the first IC die 210 and/or to the surface 246 of the encapsulant 240, the coils 212, 232 may be aligned with each other, and the surfaces 218, 246 of the first IC die 210 and the encapsulant 240 may be brought together (with the adhesive layers 244 and dielectric layer(s) 262 intervening). As discussed previously, the adhesive layers 244 may include one or more layers of organic and/or inorganic adhesives, and the additional dielectric layer(s) 262 may include BCB or another suitable material. A curing process may be performed to solidify the bond between the first IC die 210 and the molded sub-assembly 290. As discussed in conjunction with FIG. 3, in an alternate embodiment, surface 318 of the first IC die 310 and the sub-assembly 390 (or more specifically the surface 338 of the second IC die 330) alternatively may be bonded together using non-conductive adhesive 344 (e.g., a curable epoxy or another suitable material). In such an embodiment, one or more additional layers of dielectric material (e.g., layer 362) may be included between the coils 312, 332 (e.g., the dielectric layer(s) may be connected to the surface 318 of the first IC die 310 (as shown), the second IC die 330, or both, in various embodiments).

In block 514, the bond pads 285 of the interposer substrate 280 are electrically coupled to package leads 274 with wirebonds 254. In block 516, the first IC die 210, the molded sub-assembly 290, the device substrate 270, portions of leads 272, 274, and wirebonds 250, 254 are covered with encapsulant 260. According to an embodiment, encapsulation may include performing a transfer molding process using a curable molding compound (e.g., a molding encapsulant polymer system or thermoset plastic system). In an embodiment in which multiple devices 200 are formed in parallel on a lead frame strip or array, the lead frame strip or array may be placed in a mold that isolates portions of the leads prior to dispensing the molding compound. After the molding compound is cured, the individual devices 200 may be separated from the lead frame strip or array by excising supporting tie-bars from the lead frame strip or array in block 518.

Completion of this process results in individual inductive communication devices, such as device 200 (FIG. 2) or device 300 (FIG. 3). After fabrication of the inductive communication device is completed, the device may then be integrated into a system in which galvanic isolation between circuits is desired (e.g., system 100, FIG. 1). For example, as discussed previously, embodiments of inductive communication devices described herein may be incorporated into a battery charging system for a Hybrid Electronic Vehicle (HEV), a portion of an AC power isolation system, an isolated gate driver, or other types of system in which galvanic isolation between first and second circuits is desired.

It should be understood that the various method steps illustrated in FIG. 5 may be performed in orders other than the example order illustrated, and/or the method may include more, fewer, or different steps. In addition, certain steps may be collapsed into a single step, and other single steps may be expanded into multiple steps. In addition, certain ones of the method steps may be performed in parallel, rather than serially. Those of skill in the art would understand how to modify the illustrated flowchart in manners that produce substantially the same result. Accordingly, such modifications are intended to be included within the scope of the inventive subject matter.

Various embodiments of arrangements of different types of IC die within an inductive communication device will now be described in conjunction with FIGS. 10-12. More particularly, FIGS. 10-12 depict embodiments that include a single communication path that includes a single primary/secondary coil pair (FIG. 10), multiple parallel communication paths, each of which includes a single primary/secondary coil pair (FIG. 11), and a single communication path that includes multiple primary/secondary coil pairs (FIG. 12).

FIG. 10 is a top view of a portion of an inductive communication device 1000 (e.g., device 200 or 300, FIGS. 2, 3) with a single communication path that includes a single primary/secondary coil pair 1012, 1032, according to an example embodiment. More particularly, FIG. 10 illustrates a top view of a first IC die 1010 (e.g., IC die 210, 310), which includes a first coil 1012 (e.g., coil 212, 312) proximate to the top surface of the first IC die 1010, first communication circuitry 1014 (e.g., circuitry 214, 314), and a plurality of first bond pads 1016 (e.g., bond pads 216, 316). The first communication circuitry 1014 may be transmitter (TX), receiver (RX), or transceiver (TX/RX) circuitry, in various embodiments. The first bond pads 1016 are electrically coupled to leads 1072 (e.g., leads 272, 372) of the device 1000 with wirebonds 1050 (e.g., wirebonds 250, 350).

Coil 1012 consists of a continuous conductive structure (i.e., continuous between an input terminal and an output terminal) that includes multiple substantially-concentric conductive rings that may be located in multiple conductive layers of the first IC die 1010. In FIG. 10 (and also in FIGS. 11 and 12), coil 1012 does not appear to consist of a continuous conductive structure between the input and output terminals, as there are various apparent discontinuities shown within coil 1012. The discontinuities are shown to simplify the depiction of coil 1012, and also to indicate that the coil's concentric rings may be coupled through conductive vias to concentric rings in underlying conductive layers, further conveying that the structure of coil 1012 may be a multi-layer structure that includes a plurality of cross-overs to establish a continuous conductive structure.

Also depicted in FIG. 10 is second IC die 1030 (e.g., IC die 230, 330) overlying and partially overlapping the first IC die 1010. The second IC die 1030 includes a second coil 1032 (e.g., coil 232, 332, which is not specifically apparent as the second coil 1032 is substantially aligned with and overlies the first coil 1012), second communication circuitry 1034 (e.g., circuitry 234, 334), and a second plurality of bond pads 1036 (e.g., bond pads 236, 336).

The second IC die 1030 is coupled to an interposer substrate 1080 (e.g., substrate 280, 380), which includes a third plurality of bond pads 1083 (e.g., bond pads 283, 383) on one surface, and a fourth plurality of bond pads 1085 (e.g., bond pads 285, 385) on an opposite surface. The third plurality of bond pads 1083 are electrically coupled to the bond pads 1036 of the second IC die 1030 with wirebonds 1052 (e.g., wirebonds 252, 352). In addition, the fourth plurality of bond pads 1085 are electrically coupled with leads 1074 (e.g., leads 274, 374) with wirebonds 1054 (e.g., wirebonds 254, 354).

Some of the leads 1072, 1074 may be used to receive voltage supplies (e.g., power and ground), and other ones of the leads 1072, 1074 may be used to receive input signals, convey output signals, receive control signals, or to convey other types of signals. Although each set of bond pads 1016, 1036, 1083, 1085 is shown to include four bond pads 1016, 1036, 1083, 1085, each IC 1010, 1030 and interposer substrate 1080 may include more or fewer bond pads. Further, the device 1000 may include more or fewer leads 1072, 1074.

Not depicted in FIG. 10 is encapsulant (e.g., encapsulant 240, 260, 340, 360) that encapsulates the ICs 1010, 1030, interposer substrate 1080, wirebonds 1050, 1052, 1054, and the device substrate (e.g., device substrate 270, 370). Also not depicted are adhesive layers or material (e.g., adhesive 244, 344) that physically couples the ICs 1010, 1030, and that is present in the gap between the coils 1012, 1032.

As with the previously described embodiments, when arranged to provide inductive communication between coils 1012, 1032 of the first and second IC die 1010, 1030, the surfaces of the first and second IC die 1010, 1030 to which the coils 1012, 1032 are proximate are oriented to face each other. In addition, the coils 1012, 1032 are substantially aligned with each other across a gap (e.g., gap 170, FIG. 1), which is established at least in part by the dielectric material (e.g., dielectric material 242, 342) between the coils.

The embodiment depicted in FIG. 10 provides for a single one-way or bi-directional communication path. For example, when first communication circuitry 1014 includes transmitter circuitry and second communication circuitry 1034 includes receiver circuitry, a one-way communication path may be established from left to right in FIG. 10, or more specifically from leads 1072 through wirebonds 1050, first bond pads 1016, transmitter circuitry 1014, first coil 1012, second coil 1032, receiver circuitry 1034, second bond pads 1036, wirebonds 1052, third bond pads 1083, fourth bond pads 1085, wirebonds 1054, and leads 1074. Conversely, when first communication circuitry 1014 includes receiver circuitry and second communication circuitry 1034 includes transmitter circuitry, a one-way communication path may be established from right to left in FIG. 10, or more specifically from leads 1074 through wirebonds 1054, fourth bond pads 1085, third bond pads 1083, wirebonds 1052, second bond pads 1036, transmitter circuitry 1034, second coil 1032, first coil 1012, receiver circuitry 1014, first bond pads 1016, wirebonds 1050, and leads 1072. When first and second communication circuitry 1014, 1034 each include transceiver circuitry, a bi-directional communication path may be established between the leads 1072, 1074 (e.g., a full-duplex, time-duplexed, or frequency-duplexed communication path).

FIG. 11 is a top view of a portion of an inductive communication device 1100 (e.g., device 200 or 300, FIGS. 2, 3) with two communications paths, each of which includes a single primary/secondary coil pair (i.e., coil pair 1112, 1132 and coil pair 1113, 1133), according to another example embodiment. More specifically, FIG. 11 illustrates a top view of a first IC die 1110 (e.g., IC die 210, 310), a second IC die 1130 (e.g., IC die 230, 330) overlying and partially overlapping the first IC die 1110, an interposer substrate 1180 (e.g., substrate 280, 380) coupled to the second IC die 1130, leads 1172, 1174 (e.g., leads 272, 274, 372, 374), and wirebonds 1150, 1152, 1154 (e.g., wirebonds 250, 252, 254, 350, 352, 354) electrically coupled between the leads 1172, 1174, IC dies 1110, 1130, and interposer substrate 1180.

The first IC die 1110 includes first and second, spatially-separated coils 1112, 1113 (e.g., two instances of coil 212, 312) proximate to the top surface of the first IC die 1110, first transmitter circuitry 1114 (e.g., a transmitter instantiation of circuitry 214, 314), first receiver circuitry 1115 (e.g., a receiver instantiation of circuitry 214, 314), and a plurality of first bond pads 1116 (e.g., bond pads 216, 316). The second IC die 1130 includes third and fourth, spatially-separated coils 1132, 1133 (e.g., two instances of coil 232, 332, which are not specifically apparent as the third and fourth coils 1132, 1133 are substantially aligned with and overlie the first and second coils 1112, 1113, respectively), second receiver circuitry 1134 (e.g., a receiver instantiation of circuitry 234, 334), second transmitter circuitry 1135 (e.g., a transmitter instantiation of circuitry 234, 334), and a second plurality of bond pads 1136 (e.g., bond pads 236, 336).

The second IC die 1130 is coupled to an interposer substrate 1180 (e.g., substrate 280, 380), which includes a third plurality of bond pads 1183 (e.g., bond pads 283, 383) on one surface, and a fourth plurality of bond pads 1185 (e.g., bond pads 285, 385) on an opposite surface. The third plurality of bond pads 1183 are electrically coupled to the bond pads 1136 of the second IC die 1130 with wirebonds 1152 (e.g., wirebonds 252, 352). In addition, the fourth plurality of bond pads 1185 are electrically coupled with leads 1174 (e.g., leads 274, 374) with wirebonds 1154 (e.g., wirebonds 254, 354).

Some of leads 1172, 1174 may be used to receive voltage supplies (e.g., power and ground), and other ones of leads 1172, 1174 may be used to receive input signals, convey output signals, receive control signals, or to convey other types of signals. Although each set of leads 1172, 1174 and bond pads 1116, 1136, 1183, 1185 is shown to include eight leads 1172, 1174 and bond pads 1116, 1136, 1183, 1185, device 1100 may include more or fewer leads and/or bond pads.

Not depicted in FIG. 11 is encapsulant (e.g., encapsulant 240, 260, 340, 360) that encapsulates the ICs 1110, 1130, interposer substrate 1180, wirebonds 1150, 1152, 1154, and the device substrate (e.g., device substrate 270, 370). Also not depicted are adhesive layers or material (e.g., adhesive 244, 344) that physically couples the ICs 1110, 1130, and that is present in the gap between the coils 1112, 1113, 1132, 1133.

As with the previously described embodiments, when arranged to provide inductive communication between coils 1112, 1113, 1132, 1133 of the first and second IC die 1110, 1130, the surfaces of the first and second IC die 1110, 1130 to which the coils 1112, 1113, 1132, 1133 are proximate are oriented to face each other. In addition, the coils 1112, 1113, 1132, 1133 are substantially aligned with each other across a gap (e.g., gap 170, FIG. 1), which is established at least in part by the dielectric material (e.g., dielectric material 242, 342) between the coils.

The embodiment depicted in FIG. 11 provides for two, one-way communication paths. More specifically, a first one-way communication path may be established from left to right in FIG. 11, or more specifically from leads 1172 through wirebonds 1150, first bond pads 1116, first transmitter circuitry 1114, first coil 1112, third coil 1132, second receiver circuitry 1134, second bond pads 1136, wirebonds 1152, third bond pads 1183, fourth bond pads 1185, wirebonds 1154, and leads 1174. In addition, a second one-way communication path may be established from right to left in FIG. 11, or more specifically from leads 1174 through wirebonds 1154, fourth bond pads 1185, third bond pads 1183, wirebonds 1152, second bond pads 1136, second transmitter circuitry 1135, fourth coil 1133, second coil 1113, first receiver circuitry 1115, first bond pads 1116, wirebonds 1150, and leads 1172. With the first and second communication paths being in opposite directions, the embodiment of FIG. 11 may essentially function as a transceiver.

FIG. 12 is a top view of a portion of an inductive communication device 1200 (e.g., device 200 or 300, FIGS. 2, 3) with a single communications path, which includes two primary/secondary coil pairs (i.e., coil pair 1212, 1232 and coil pair 1213, 1233), according to yet another example embodiment. More particularly, FIG. 12 illustrates a top view of a first IC die 1210 (e.g., IC die 210, 310), a second IC die 1230 (e.g., IC die 230, 330) overlying and partially overlapping the first IC die 1210, an interposer substrate 1280 (e.g., substrate 280, 380) coupled to the second IC die 1230, leads 1272, 1274 (e.g., leads 272, 274, 372, 374), and wirebonds 1250, 1252, 1254 (e.g., wirebonds 250, 252, 254, 350, 352, 354) electrically coupled between the leads 1272, 1274, IC dies 1210, 1230, and interposer substrate 1280.

The first IC die 1210 includes first and second, spatially-separated coils 1212, 1213 (e.g., two instances of coil 212, 312) proximate to the top surface of the first IC die 1210, first communication circuitry 1214 (e.g., circuitry 214, 314, which may be transmitter circuitry, receiver circuitry, or transceiver circuitry), and a plurality of first bond pads 1216 (e.g., bond pads 216, 316). The second IC die 1230 includes third and fourth, spatially-separated coils 1232, 1233 (e.g., two instances of coil 232, 332, which are not specifically apparent as the third and fourth coils 1232, 1233 are substantially aligned with and overlie the first and second coils 1212, 1213, respectively), second communication circuitry 1234 (e.g., circuitry 234, 334, which may be transmitter circuitry, receiver circuitry, or transceiver circuitry), and a second plurality of bond pads 1236 (e.g., bond pads 236, 336).

The second IC die 1230 is coupled to an interposer substrate 1280 (e.g., substrate 280, 380), which includes a third plurality of bond pads 1283 (e.g., bond pads 283, 383) on one surface, and a fourth plurality of bond pads 1285 (e.g., bond pads 285, 385) on an opposite surface. The third plurality of bond pads 1283 are electrically coupled to the bond pads 1236 of the second IC die 1230 with wirebonds 1252 (e.g., wirebonds 252, 352). In addition, the fourth plurality of bond pads 1285 are electrically coupled with leads 1274 (e.g., leads 274, 374) with wirebonds 1254 (e.g., wirebonds 254, 354).

Some of leads 1272, 1274 may be used to receive voltage supplies (e.g., power and ground), and other ones of leads 1272, 1274 may be used to receive input signals, convey output signals, receive control signals, or to convey other types of signals. Although each set of leads 1272, 1274 and bond pads 1216, 1236, 1283, 1285 is shown to include four leads 1272, 1274 and bond pads 1216, 1236, 1283, 1285, device 1200 may include more or fewer leads and/or bond pads.

Not depicted in FIG. 12 is encapsulant (e.g., encapsulant 240, 260, 340, 360) that encapsulates the ICs 1210, 1230, interposer substrate 1280, wirebonds 1250, 1252, 1254, and the device substrate (e.g., device substrate 270, 370). Also not depicted are adhesive layers or material (e.g., adhesive 244, 344) that physically couples the ICs 1210, 1230, and that is present in the gap between the coils 1212, 1213, 1232, 1233.

As with the previously described embodiments, when arranged to provide inductive communication between coils 1212, 1213, 1232, 1233 of the first and second IC die 1210, 1230, the surfaces of the first and second IC die 1210, 1230 to which the coils 1212, 1213, 1232, 1233 are proximate are oriented to face each other. In addition, the coils 1212, 1213, 1232, 1233 are substantially aligned with each other across a gap (e.g., gap 170, FIG. 1), which is established at least in part by the dielectric material (e.g., dielectric material 242, 342) between the coils.

The embodiment depicted in FIG. 12 provides for a single one-way or bi-directional communication path, where the communication signal includes multiple signal components that are conveyed by the transmitter circuitry to two primary coils in parallel. Two corresponding secondary coils receive the communication signal and provide it to receiver circuitry, which proceeds to further process the signals. For example, when first communication circuitry 1214 includes transmitter circuitry and second communication circuitry 1234 includes receiver circuitry, a one-way communication path may be established from left to right in FIG. 12, or more specifically from leads 1272 through wirebonds 1250, first bond pads 1216, transmitter circuitry 1214, in parallel through first and second (primary) coils 1212, 1213, again in parallel through third and fourth (secondary) coils 1232, 1233, receiver circuitry 1234, second bond pads 1236, wirebonds 1252, third bond pads 1283, fourth bond pads 1285, wirebonds 1254, and leads 1274. Conversely, when first communication circuitry 1214 includes receiver circuitry and second communication circuitry 1234 includes transmitter circuitry, a one-way communication path may be established from right to left in FIG. 12, or more specifically from leads 1274 through wirebonds 1254, fourth bond pads 1285, third bond pads 1283, wirebonds 1252, second bond pads 1236, transmitter circuitry 1234, in parallel through third and fourth (primary) coils 1232, 1233, in parallel through first and second (secondary) coils 1212, 1213, receiver circuitry 1214, first bond pads 1216, wirebonds 1250, and leads 1272. When first and second communication circuitry 1214, 1234 each include transceiver circuitry, a bi-directional communication path may be established between the leads 1272, 1274, where the communication signal includes multiple signal components that are inductively communicated through the two primary/secondary coil pairs (or two communication channels) in parallel.

Each of the example embodiments illustrated in FIGS. 10-12 depict one or two communication paths, where each communication path provides for inductive communication using one or two primary/secondary coil pairs. Other embodiments may include multiple one-way communication paths in a particular direction (e.g., one IC die may include multiple instantiations of transmitter circuitry and corresponding primary coils and the other IC die may include the same number of instantiations of secondary coils and corresponding receiver circuitry). Still other embodiments may include multiple one-way communication paths in both directions (e.g., each IC die may include multiple instantiations of both transmitter and receiver circuitry and corresponding primary and secondary coils). Still other embodiments may include multiple bi-directional communication paths (e.g., each IC die may include multiple instantiations of transceiver circuitry and corresponding primary and secondary coils). Such embodiments are encompassed by the scope of the inventive subject matter.

In addition, in FIGS. 10-12, each coil is depicted as four concentric, hexagonal conductive rings. In other embodiments, the conductive rings comprising a coil may have different shapes, and/or different numbers of concentric rings. In addition, as discussed previously, each coil may be formed using concentric rings within multiple conductive layers (e.g., as depicted in FIG. 4). In other embodiments, each coil may be formed using concentric rings within a different number of conductive layers from the embodiments depicted in the Figures.

An embodiment of a packaged device includes first and second package leads, a first integrated circuit (IC) die, and a sub-assembly that includes a second IC die coupled to a substrate. The first IC die has a first coil, and the second IC die has a second coil. The first and second IC die are arranged within the device so that the first and second coils are aligned with each other across a gap between the first and second IC die, and the first and second IC die are galvanically isolated from each other. The first IC die is electrically coupled to the first package lead (e.g., with a wirebond), and a substrate bond pad is electrically coupled to the second package lead (e.g., with a wirebond). The sub-assembly also may include encapsulation at least over a wirebond that electrically couples the second IC die to the substrate.

An embodiment of a method of manufacturing an inductive communication device includes forming a sub-assembly by coupling a first die surface of a first IC die to a first substrate surface of a first substrate. The first IC die also has a second die surface and a first coil proximate to the second die surface, and the first substrate also has a first substrate bond pad. The method further includes coupling the sub-assembly to a second IC die. The second IC die has a second coil proximate to a first die surface of the second IC die. The sub-assembly is coupled to the second IC die so that the second die surface of the first IC die faces the first die surface of the second IC die, and the first coil and the second coil are aligned with each other across a gap between the first IC die and the second IC die. The first IC die and the second IC die are galvanically isolated from each other. The method further includes electrically coupling the second IC die to a first package lead, and electrically coupling the first substrate bond pad to a second package lead.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

For simplicity and clarity of illustration, the drawing figures illustrate the general manner of construction, and descriptions and details of well-known features and techniques may be omitted to avoid unnecessarily obscuring the description of the embodiments. Additionally, elements in the drawings figures are not necessarily drawn to scale. For example, the dimensions of some of the elements or regions in some of the figures may be exaggerated relative to other elements or regions of the same or other figures to help improve understanding of the various embodiments.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments described herein may be used, for example, in other orientations than those illustrated or otherwise described herein. The term "coupled," as used herein, is defined as directly or indirectly connected in an electrical or non-electrical manner.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A packaged device comprising:
a first package lead;
a second package lead;
a first integrated circuit (IC) die having a first coil proximate to a first die surface of the first IC die, wherein the first IC die is electrically coupled to the first package lead; and
a sub-assembly that includes
a first substrate having a first substrate surface, a second substrate surface, and a first substrate bond pad that is electrically coupled to the second package lead, and
a second IC die having a second coil proximate to a first die surface of the second IC die, wherein a second die surface of the second IC die is coupled to the first substrate surface, and
wherein the first IC die and the second IC die are arranged within the device so that the first die surface of the first IC die faces the first die surface of the second IC die, and the first coil and the second coil are aligned with each other across a gap between the first IC die and the second IC die, and wherein the first IC die and the second IC die are galvanically isolated from each other.

2. The device of claim 1, wherein:
the first substrate bond pad is exposed at the second substrate surface;
the first substrate has a second substrate bond pad exposed at the first substrate surface, wherein the second substrate bond pad is electrically connected to the first substrate bond pad through the first substrate;

the second IC die further includes a first IC bond pad exposed at the first die surface of the second IC die, wherein the first IC bond pad is electrically coupled to the second coil; and the sub-assembly further comprises a first wirebond coupled between the second substrate bond pad and the first IC bond pad.

3. The device of claim 2, wherein the sub-assembly further comprises:

first encapsulant covering the first wirebond.

4. The device of claim 3, wherein:

the first encapsulant also covers the second IC die and the first substrate surface;

the first encapsulant has a substantially planar surface above the first die surface of the second IC die; and the substantially planar surface of the first encapsulant is coupled to the first die surface of the first IC die.

5. The device of claim 4, further comprising:

adhesive material coupling the substantially planar surface of the first encapsulant to the first die surface of the first IC die.

6. The device of claim 3, wherein:

the first encapsulant has a glob top configuration over the first wirebond; and the device further comprises adhesive material coupling the first die surface of the first IC die to the first die surface of the second IC die.

7. The device of claim 3, further comprising:

second encapsulant covering the sub-assembly, the first IC die, and portions of the first and second package leads.

8. The device of claim 1, further comprising:

one or more layers of dielectric material between the first and second coils.

9. The device of claim 1, further comprising:

a wirebond coupled between the first substrate bond pad and the second package lead.

10. The device of claim 1, wherein:

the first IC die further includes a first IC bond pad exposed at the first die surface of the first IC die; and the device further comprises a wirebond coupled between the first IC bond pad and the first package lead.

11. The device of claim 1, further comprising:

inter-coil dielectric material between the first and second coils, wherein the inter-coil dielectric material has a thickness in a range of 25 micrometers to 400 micrometers, and a dielectric constant of the inter-coil dielectric material is in a range of 2.0 to 5.0.

12. The device of claim 1, further comprising:

a second substrate, wherein a second die surface of the first IC die is coupled to the second substrate, and wherein the second substrate, the first package lead, and the second package lead form portions of a lead frame.

13. The device of claim 1, wherein:

the first coil is formed from a plurality of first patterned conductors in a plurality of first metal layers that are separated by one or more first dielectric layers; and the second coil is formed from a plurality of second patterned conductors in a plurality of second metal layers that are separated by one or more second dielectric layers.

14. The device of claim 1, wherein:

the first IC die further includes first communication circuitry coupled to the first coil; and the second IC die further includes second communication circuitry coupled to the second coil.

15. The device of claim 1, wherein:

the first IC die further includes one or more additional first coils proximate to the first die surface of the first IC die; and the second IC die further includes one or more additional second coils proximate to the first die surface of the second IC die, wherein each of the additional first coils is aligned with a corresponding one of the additional second coils across the gap.

16. A method of manufacturing an inductive communication device, the method comprising the steps of:

forming a sub-assembly by
coupling a first die surface of a first integrated circuit (IC) die to a first substrate surface of a first substrate, wherein the first IC die also has a second die surface and a first coil proximate to the second die surface, and wherein the first substrate also has a first substrate bond pad;

coupling the sub-assembly to a second IC die, wherein the second IC die has a second coil proximate to a first die surface of the second IC die, and wherein the sub-assembly is coupled to the second IC die so that the second die surface of the first IC die faces the first die surface of the second IC die, and the first coil and the second coil are aligned with each other across a gap between the first IC die and the second IC die, and wherein the first IC die and the second IC die are galvanically isolated from each other;

electrically coupling the second IC die to a first package lead; and electrically coupling the first substrate bond pad to a second package lead.

17. The method of claim 16, wherein:

the first substrate bond pad is exposed at a second substrate surface of the first substrate; and forming the sub-assembly further comprises coupling a wirebond between the first IC die and a second substrate bond pad that is exposed at the first substrate surface.

18. The method of claim 17, wherein forming the sub-assembly further comprises applying a first encapsulant to cover the wirebond.

19. The method of claim 18, wherein applying the first encapsulant further comprises also applying the first encapsulant to the first IC die and to the first substrate surface.

20. The method of claim 16, wherein coupling the sub-assembly to the second IC die comprises coupling the sub-assembly to the second IC die with an adhesive material.

21. The method of claim 16, wherein:

electrically coupling the second IC die to the first package lead comprises coupling a first wirebond between the second IC die and the first package lead; and electrically coupling the first substrate bond pad to the second package lead comprises coupling a second wirebond between the first substrate bond pad and the second package lead.

* * * * *